United States Patent
Twu et al.

(10) Patent No.: US 6,706,577 B1
(45) Date of Patent: Mar. 16, 2004

(54) FORMATION OF DUAL GATE OXIDE BY TWO-STEP WET OXIDATION

(75) Inventors: Jih-Churng Twu, Taipei (TW);
Syun-Ming Jang, Hsin-Chu (TW);
Chen-Hua Yu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 510 days.

(21) Appl. No.: 09/298,879

(22) Filed: Apr. 26, 1999

(51) Int. Cl.[7] ................. H01L 21/8238; H01L 21/8249; H01L 21/8242
(52) U.S. Cl. ................. 438/199; 438/235; 438/238; 438/247; 438/249
(58) Field of Search ................. 438/199, 238, 438/235, 247, 249

(56) References Cited

U.S. PATENT DOCUMENTS

| | | | |
|---|---|---|---|
| 5,210,056 A | * 5/1993 | Pong | 437/239 |
| 5,244,843 A | 9/1993 | Chau et al. | 437/239 |
| 5,470,611 A | 11/1995 | Yang et al. | 427/255.4 |
| 5,502,009 A | 3/1996 | Lin | 437/239 |
| 5,538,923 A | 7/1996 | Gardner et al. | 437/238 |
| 5,595,922 A | 1/1997 | Tigelaar et al. | 437/40 |
| 5,668,035 A | 9/1997 | Fang et al. | 438/239 |
| 5,702,988 A | * 12/1997 | Liang | 438/238 |
| 5,861,347 A | * 1/1999 | Maiti et al. | 438/787 |
| 5,920,779 A | * 7/1999 | Sun et al. | 438/275 |
| 5,953,599 A | * 9/1999 | El-Diwany | 438/199 |
| 5,985,727 A | * 11/1999 | Burr | 438/302 |
| 5,989,948 A | * 11/1999 | Vines et al. | 438/216 |
| 5,994,176 A | * 11/1999 | Wu | 438/200 |
| 6,022,770 A | * 2/2000 | Hook et al. | 438/211 |
| 6,133,119 A | * 10/2000 | Yamazaki | 438/476 |

FOREIGN PATENT DOCUMENTS

KR         9210432 B    * 11/1992

* cited by examiner

Primary Examiner—Long Pham
Assistant Examiner—Shrinivas Rao
(74) Attorney, Agent, or Firm—George O. Saile; Stephen B. Ackerman; Rosemary L.S. Pike

(57) ABSTRACT

A method of simultaneously forming differential gate oxide for both high and low voltage transistors using a two-step wet oxidation process is described. A semiconductor substrate is provided wherein active areas of the substrate are isolated from other active areas and wherein there is at least one low voltage area in which a low voltage transistor will be formed and at least one high voltage area in which a high voltage transistor will be formed. The surface of the semiconductor substrate is wet oxidized to form a first layer of gate oxide on the surface of the semiconductor substrate in the active areas. The low voltage active area is covered with a mask. The surface of the semiconductor substrate is wet oxidized again where it is not covered by the mask to form a second layer of gate oxide under the first gate oxide layer in the high voltage active area. The mask is removed. A layer of polysilicon is deposited overlying the first gate oxide layer in the low voltage active area and overlying the second gate oxide layer in the high voltage active area and patterned to form gate electrodes for the low voltage and high voltage transistors in the fabrication of an integrated circuit.

19 Claims, 4 Drawing Sheets

FORMATION OF DUAL GATE OXIDE BY TWO-STEP WET OXIDATION

BACKGROUND OF THE INVENTION (1) Field of the Invention

The invention relates to a method of fabricating both high and low voltage CMOS transistors in the fabrication of integrated circuits, and more particularly, to a method of fabricating both high and low voltage CMOS transistors simultaneously by forming dual gate silicon oxide layers using a two-step wet oxidation process in the fabrication of integrated circuits.

(2) Description of the Prior Art

With the advent of large scale integration, many of the integrated circuits formed on a semiconductor substrate comprise several circuit functions on a single chip. To optimize the devices and improve performance, it is desirable in the industry to provide field effect transistors (FET) having both thick and thin gate oxide layers thereunder. For example, typically a thin gate oxide is used in peripheral low voltage logic circuits to enhance FET device performance, while a thicker gate oxide is required for the high voltage FET access transistors in a DRAM cell.

The gate oxide thickness is the major issue in terms of reliability considerations in mixing high and low voltage transistors in one device. For example, in a 0.25 micron process, a thin gate oxide of about 40 Angstroms is grown by a dry oxidation process over both high and low voltage areas. This provides the proper gate oxide thickness for a low voltage transistor. A second wet oxidation is performed over the first gate oxide in the high voltage area to provide a thick gate oxide of about 90 Angstroms.

Shallow trench isolation (STI) has become increasingly common as device sizes shrink. Many workers in the art have addressed the problem of trench filling while avoiding dishing and other problems. Co-pending U.S. Patent Application Ser. No. 08/794,597 to S. M. Jang et al, filed on Feb. 3, 1997, discloses filling STI using high density plasma chemically vapor deposited (HDPCVD) oxide and polishing to form planarized STI regions.

For example, FIG. 1 shows a simplified illustration of a partially completed integrated circuit device in which the low voltage area 3 is shown on the left side of the figure and the high voltage area 5 is shown on the right side of the figure and where, for clarity's sake, a dotted line is shown dividing the low and high voltage areas.

The active areas of the substrate have been isolated from one another by shallow trench isolation (STI) regions 12. Thin gate oxide 14 has been formed in the low voltage area 3 and thick gate oxide 16 has been formed in the high voltage area 5.

It has been found that the thicker gate oxide shows poor integrity when HDPCVD oxide has been used to fill the STI regions. That is, the oxide breakdown voltage is low and the defect rate is high. The thicker oxide can trap more defects from the HDPCVD oxide than does the thinner oxide resulting in poorer quality of the thicker oxide. The exact mechanism of poor oxide quality in the presence of HDPCVD oxide is unknown, but it may come from the plasma effect in which many ions, radicals, and free charge electrons are present. It is desired to find a process of forming both thick and thin gate oxide layers on a semiconductor substrate that will have high quality especially in the presence of HDPCVD oxide.

U.S. Pat. No. 5,502,009 to Lin teaches forming a first gate oxide layer using wet or dry oxidation, removing a portion of the first gate oxide layer, and then forming a second thicker gate oxide layer using wet or dry oxidation in $O_2$ where the first oxidation was removed. U.S. Pat. No. 5,595, 922 to Tigelaar et al teaches wet oxidation of a first oxide layer under a gate electrode to form a thicker gate oxide layer. U.S. Pat. No. 5,668,035 to Fang et al discloses forming a first gate oxide by dry oxidation, removing the gate oxide in one area, then forming a second thinner gate oxide by dry oxidation in the area where the first oxide layer was removed. U.S. Pat. No. 5,244,843 to Chau et al and U.S. Pat. No. 5,470,611 to Yang et al teach a dry oxidation followed by a wet oxidation. U.S. Pat. No. 5,538,923 to Gardner et al teaches a dry oxidation. None of these patents mention HDPCVD oxide.

SUMMARY OF THE INVENTION

A principal object of the present invention is to provide an effective and very manufacturable method of simultaneously forming both high and low voltage transistors in the fabrication of an integrated circuit.

Another object of the present invention is to provide an effective and very manufacturable method of simultaneously forming differential gate oxide thicknesses for both high and low voltage transistors in the fabrication of an integrated circuit.

Another object of the present invention is to form a dual thickness gate oxide using a two-step wet oxidation.

A further object of the invention is to simultaneously form differential gate oxide thicknesses for both high and low voltage transistors using a two-step wet oxidation in the fabrication of an integrated circuit.

A still further object is to improve the integrity of a dual thickness gate oxide in the fabrication of an integrated circuit.

Yet another object of the invention is to improve the integrity of a dual thickness gate oxide by using a two-step wet oxidation process.

Yet another object is to improve the integrity of a dual thickness gate oxide over shallow trench isolation in the fabrication of an integrated circuit.

Yet another object is to improve the integrity of a dual thickness gate oxide over high density plasma chemically vapor deposited (HDPCVD) oxide shallow trench isolation in the fabrication of an integrated circuit.

In accordance with the objects of this invention a new method of simultaneously forming differential gate oxide for both high and low voltage transistors using a two-step wet oxidation process is achieved. A semiconductor substrate is provided wherein active areas of the substrate are isolated from other active areas and wherein there is at least one low voltage area in which a low voltage transistor will be formed and at least one high voltage area in which a high voltage transistor will be formed. The surface of the semiconductor substrate is wet oxidized to form a first layer of gate oxide on the surface of the semiconductor substrate in the active areas. The low voltage active area is covered with a mask. The surface of the semiconductor substrate is wet oxidized again where it is not covered by the mask to form a second layer of gate oxide under the first gate oxide layer in the high voltage active area. The mask is removed. A layer of polysilicon is deposited overlying the first gate oxide layer in the low voltage active area and overlying the second gate oxide layer in the high voltage active area and patterned to form gate electrodes for the low voltage and high voltage transistors in the fabrication of an integrated circuit.

BRIEF DESCRIPTION OF THE DRAWINGS

In the accompanying drawings forming a material part of this description, there is shown:

FIGS. 3, 4, 8 and 9 schematically illustrate in cross-sectional representation a first preferred embodiment of the present invention.

FIGS. 5 through 7 schematically illustrate in cross-sectional representation a second preferred embodiment of the present invention.

DESCRIPTION OF THE PREFERRED EMBODIMENTS

Figure 1:
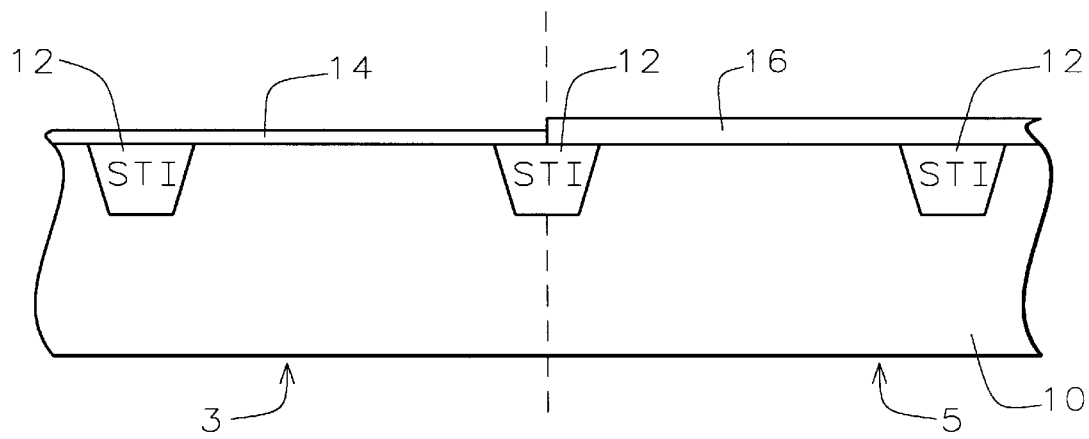
FIG. 1 schematically illustrates in cross-sectional representation an embodiment of the prior art.
Figure 2:
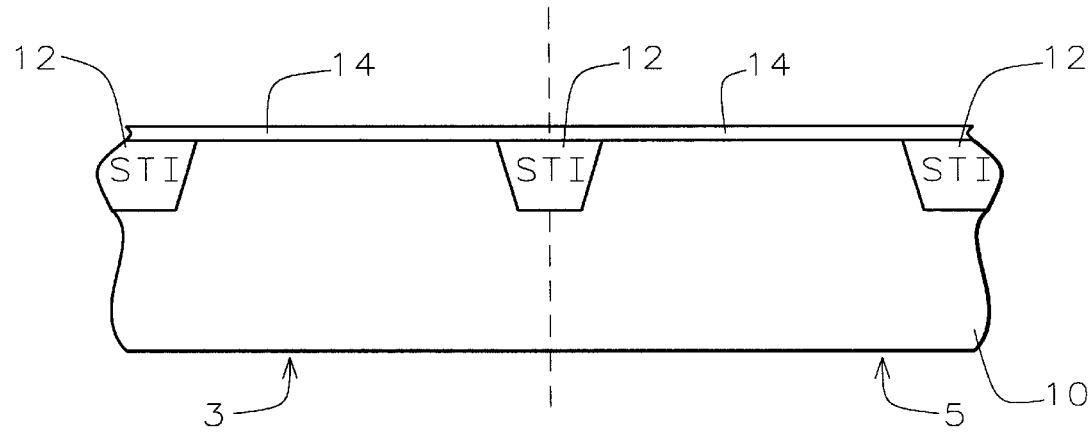
FIGS. 2 through 9 schematically illustrate in cross-sectional representation a preferred embodiment of the present invention.

Referring now more particularly to FIG. 2, there is illustrated a portion of a partially completed integrated circuit. There is shown a semiconductor substrate 10, preferably composed of monocrystalline silicon. Shallow trenches are etched into the silicon substrate using conventional photolithography and etching techniques. The shallow trenches are filled with an oxide material according to one of the various methods used in the art. For example, the trenches may be filled with high density plasma chemically vapor deposited (HDPCVD) oxide 12 and planarized as taught in the above-mentioned co-pending U.S. patent application to S. M. Jang et al. The shallow trenches may be filled with any other suitable dielectric material. Alternatively, field oxidation regions could be used in place of shallow trench isolation. The field oxidation regions may comprise HDPCVD oxide. The invention is described using shallow trench isolation filled with HDPCVD oxide to illustrate the improvement in oxide quality achieved by the invention even in this particularly difficult situation. High and low voltage devices are to be fabricated on the same semiconductor substrate. For illustration purposes, a low voltage area 3 is shown on the left side of the figure and a high voltage area 5 is shown on the right side of the figure. For clarity of understanding, a dashed line divides the low voltage and high voltage areas.

A first gate oxide layer 14 is grown on the surface of the semiconductor substrate by a wet oxidation process. $H_2/O_2$ is used as the reactant in an $N_2$ ambient. The first gate oxide layer is grown to a thickness of between about 40 and 100 Angstroms. For better control of the thickness of this gate oxide layer, $H_2$ and $O_2$ are diluted to a ratio of $H_2:O_2:N_2$ of 1:2:20.

In the past, there has been no known difference between dry and wet oxidation above quarter-micron feature sizes. Below the quarter-micron feature size, the dry (plasma) process is used more often than the wet oxidation. Dry oxidation has traditionally been easily controlled and the hardware has been easy to maintain. The wet oxidation process of the present invention has been found to be easily controlled, resulting in good oxide quality and low defects and showing good performance over HDPCVD oxide.

Figure 3:
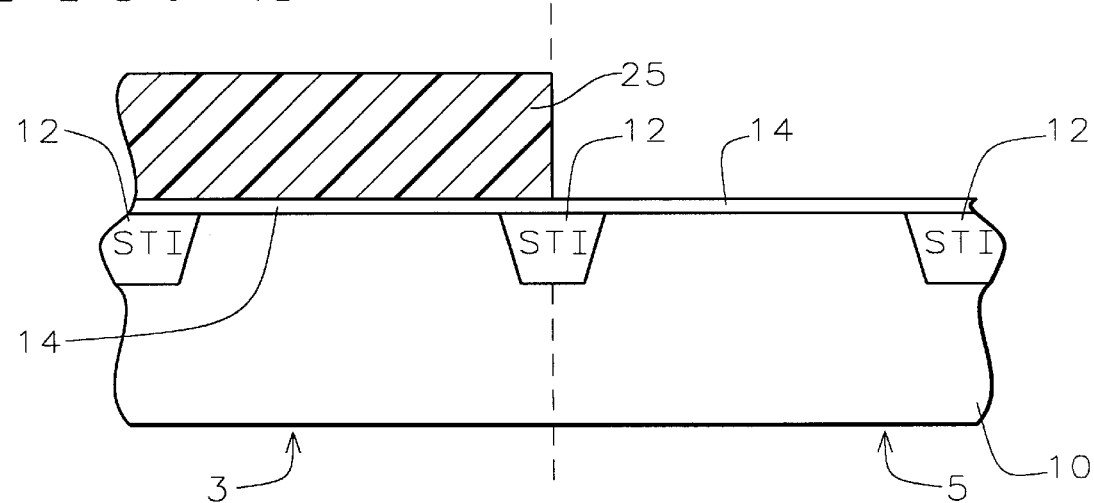

A first preferred embodiment of the present invention will be described with reference to FIGS. 3 and 4. Referring now to FIG. 3, a photoresist mask 25 is formed over the low voltage area 3. Now, the second step of the oxide formation is performed. The high voltage area 5 which is exposed by the photoresist mask 25 is subjected to a second wet oxidation.

Figure 4:
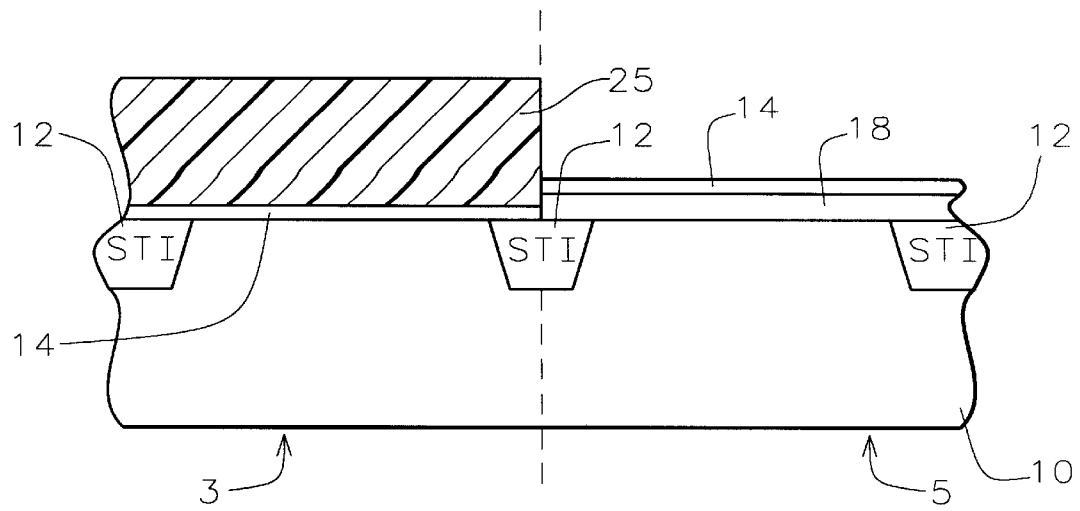

Second gate oxide layer 18 is formed under the first gate oxide layer 14, as shown in FIG. 4. Then the photoresist mask 25 is removed. The thickness of the second gate oxide layer is between about 45 and 100 Angstroms, resulting in a combined thickness of layers 14 and 18 of between about 50 and 190 Angstroms. The thicknesses of the gate oxide layers 14 and 18 have been exaggerated in the figures in order to more clearly illustrate the process of the invention. This second wet oxidation also uses $H_2/O_2$ in a $N_2$ atmosphere; however, the $N_2$ flow rate is adjusted so that the $H_2/O_2$ are more dilute. In the prior art, the thicker gate oxide layer 14/18 suffered poor integrity when it was formed over a trench filled with HDPCVD oxide. Lower breakdown voltage and high defects were seen. Defects were trapped from the plasma in the prior art dry oxidation. The two-step wet oxidation process of the present invention results in essentially defect-free gate oxide with a high breakdown voltage.

Using the two-step wet oxidation process of the present invention to form the thick oxide layer 14/18, the integrity of the thick oxide layer 14/18 is retained even in the presence of the HDPCVD oxide in the STI regions.

Figure 5:
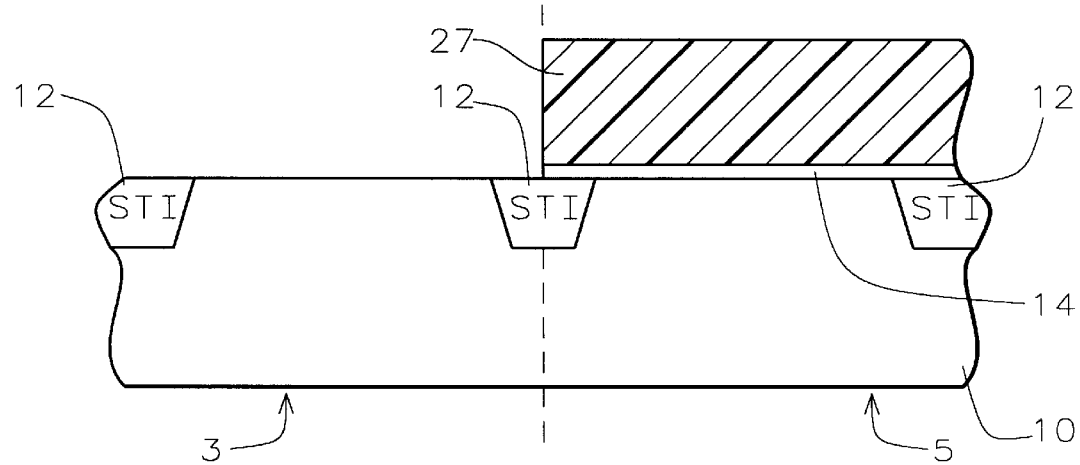
Figure 6:
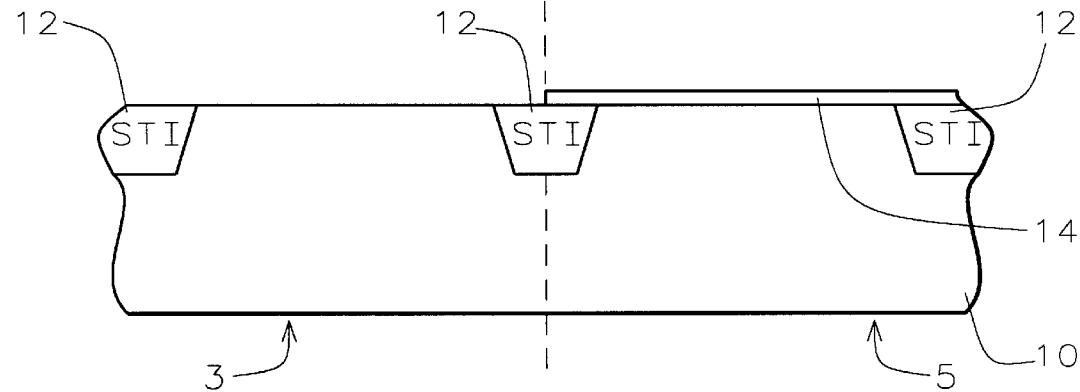

A second preferred embodiment of the present invention will be described with reference to FIGS. 5 through 7. In this case, the first oxidation may have a thickness of between about 45 and 100 Angstroms. Referring now to FIG. 5, a photoresist mask 27 is formed over the high voltage area 5 where the thick oxide is to be formed. The oxide layer 14 is removed in the low voltage area 3, as shown. The photoresist mask is removed, as shown in FIG. 6. Now, the second step of the oxide formation is performed. The entire surface of the wafer is subjected to a second wet oxidation.

Figure 7:
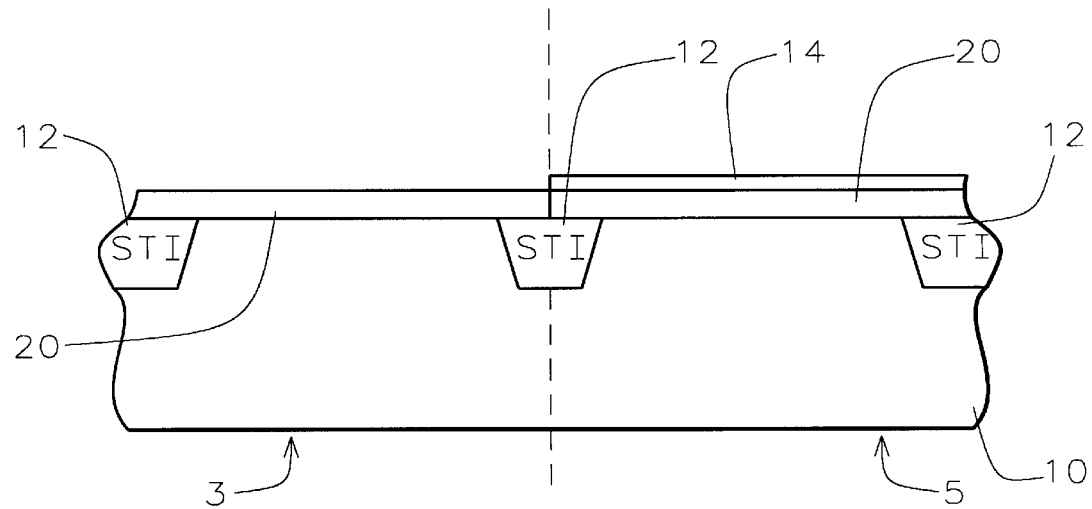

Second gate oxide layer 20 is formed on the surface of the substrate in the low voltage area 3 and under the first gate oxide layer 14 in the high voltage area 5, as shown in FIG. 7. The thickness of the second gate oxide layer is between about 40 and 100 Angstroms, resulting in a combined thickness of layers 14 and 20 in the high voltage area 5 of between about 50 and 190 Angstroms. This second wet oxidation also uses $H_2/O_2$ in a $N_2$ atmosphere; however, the $N_2$ flow rate is adjusted so that the $H_2/O_2$ are more dilute; for example having a ratio of $H_2:O_2:N_2$ of 1:2: more than 20. In the prior art, the thicker gate oxide layer 14/20 suffered poor integrity when it was formed over a trench filled with HDPCVD oxide. Lower breakdown voltage and high defects were seen. Defects were trapped from the plasma in the prior art dry oxidation. The two-step wet oxidation process of the present invention results in essentially defect-free gate oxide with a high breakdown voltage.

Using the two-step wet oxidation process of the present invention to form the thick oxide layer 14/20, the integrity of the thick oxide layer 14/20 is retained even in the presence of the HDPCVD oxide in the STI regions.

Processing now continues as is conventional in the art to form high and low voltages devices on the same substrate. The following figures illustrate the first preferred embodiment, but it is to be understood that further processing is the same for both embodiments utilizing thin oxide 14 and thick oxide 14/18 of the first embodiment or the equivalent thin oxide 20 and thick oxide 14/20 of the second embodiment.

Figure 8:
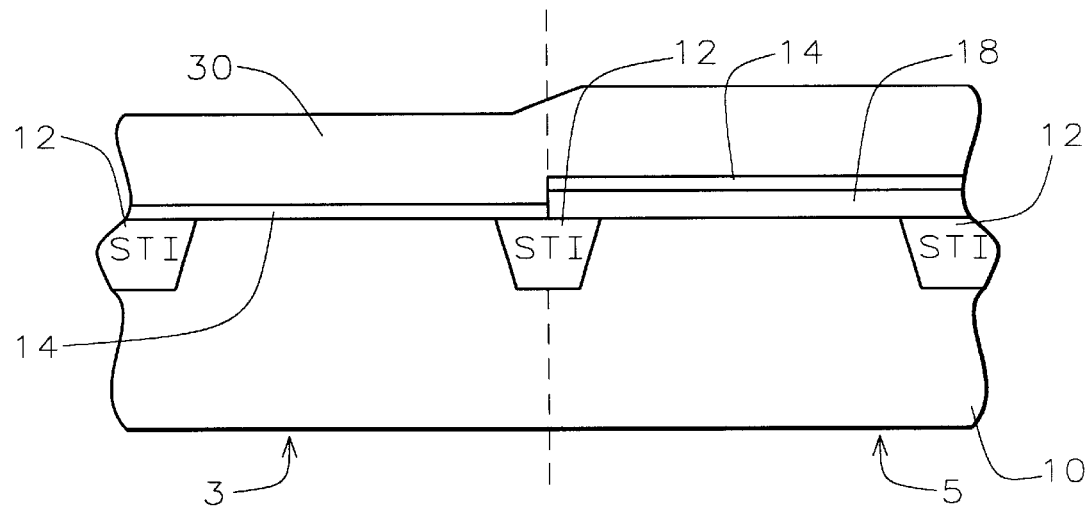

Referring now to FIG. 8, a layer of polysilicon 30 is deposited over the dual thickness gate oxide layers, 14 in the low voltage area 3 and 14/18 in the high voltage area 5. For example, polysilicon layer 30 can have a thickness of between about 1000 and 5000 Angstroms.

Figure 9:
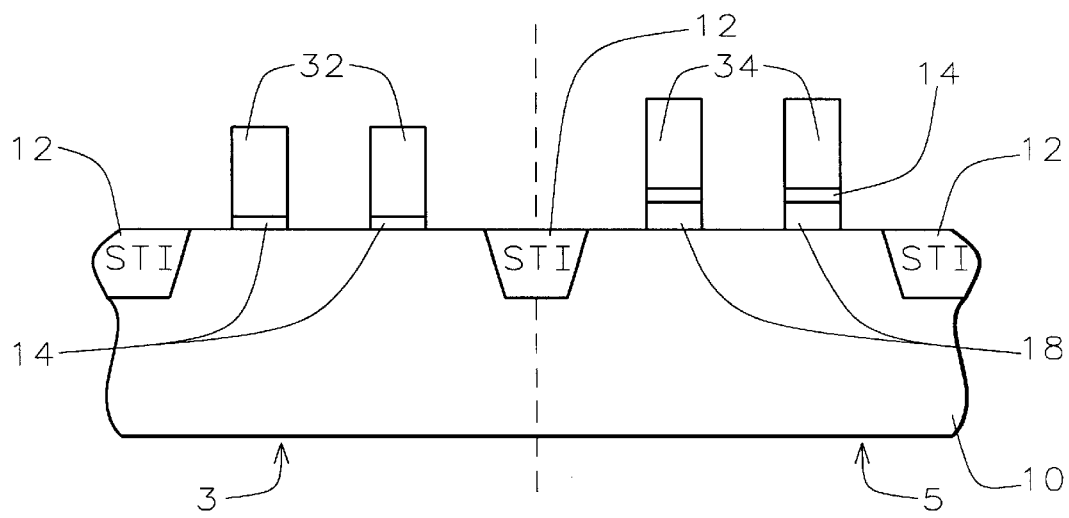

The polysilicon layer 30 is etched away where it is not covered by a mask, not shown, to form gate electrodes 32 in the low voltage area 3 and gate electrode 34 in the high voltage area 5, as illustrated in FIG. 9.

It will be understood by those skilled in the art that polycide gate electrodes may be fabricated by depositing or forming a silicide layer overlying the polysilicon layer before etching.

A central processing unit (CPU) chip is an example of a case in which it is desired to form both low and high voltage devices on the same chip. For example, high voltage is required to turn on the device while low voltage is desired in other areas to save power. For example, a low voltage device might have a voltage of 1 to 5 volts while a high voltage device might have a voltage of 5 to 10 volts.

Figure 10:
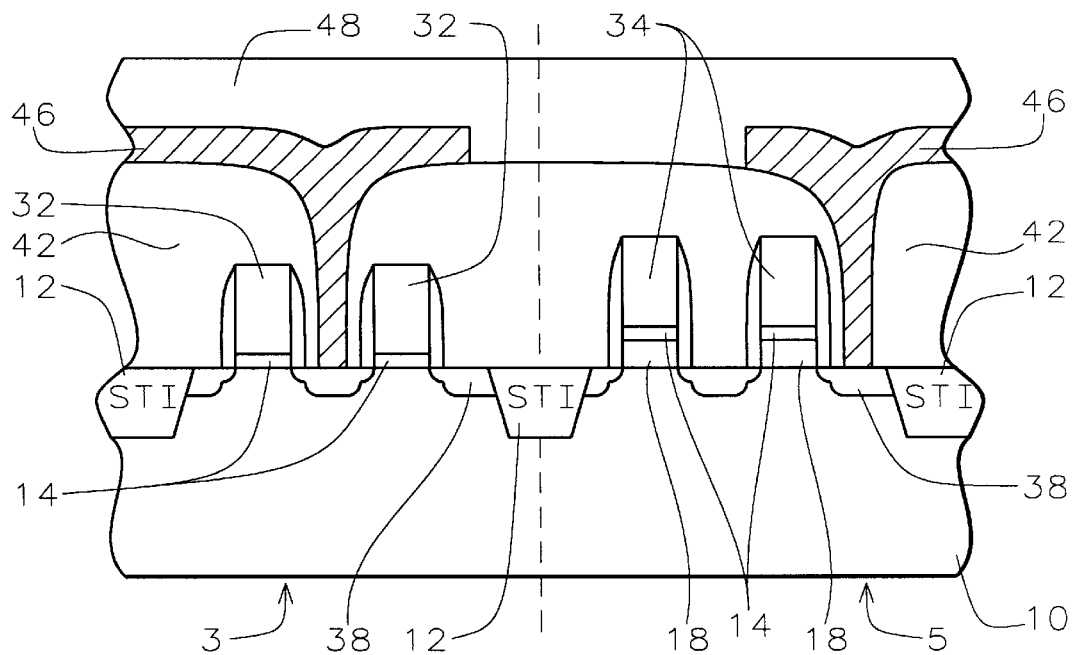
FIG. 10 schematically illustrates in cross-sectional representation a completed integrated circuit device fabricated according to the process of the present invention.

FIG. 10 illustrates a completed integrated circuit, according to the process of the present invention, with both high and low voltage transistors. Thinner gate oxide layer 14 has been formed in the low voltage area and thicker gate oxide layer 14/18 has been formed in the high voltage area according to the process of the present invention. Low voltage transistors 32 and high voltage transistors 34 are shown. It is well understood by those skilled in the art that NMOS and PMOS devices can be fabricated in either the high or low voltage areas.

For example, the integrated circuit of the present invention may be completed as shown in FIG. 10 by forming source and drain regions 38. A dielectric layer composed of, for example, borophosphosilicate glass (BPSG) and or silicon dioxide 42 covers the semiconductor device structures. Openings are made through the dielectric layer 42 to the source and drain regions 38 within the semiconductor substrate where contacts are desired. A metal layer 46, typically aluminum, is deposited to fill the contact openings and patterned. A passivation layer 48 completes fabrication of the integrated circuit.

The process of the present invention has been implemented. Data shows that the use of the two-step wet oxidation process significantly improves yield by 10%. The gate oxide integrity has also been shown to be improved by the process of the invention.

While the invention has been particularly shown and described with reference to the preferred embodiments thereof, it will be understood by those skilled in the art that various changes in form and details may be made without departing from the spirit and scope of the invention.

What is claimed is:

1. The method of simultaneously forming both a high voltage and a low voltage transistor in the manufacture of an integrated circuit comprising:

providing a semiconductor substrate wherein active areas of said substrate are isolated from other active areas and wherein there is at least one low voltage area in which said low voltage transistor will be formed and at least one high voltage area in which said high voltage transistor will be formed wherein said high voltage transistor has a voltage higher than said low voltage transistor;

first wet oxidizing the surface of said semiconductor substrate to form a first layer of gate oxide on the surface of said semiconductor substrate in said active areas;

covering said low voltage active area with a mask;

second wet oxidizing the surface of said semiconductor substrate where it is not covered by said mask to form a second layer of gate oxide underlying said first gate oxide layer in said high voltage active area wherein said second wet oxidizing comprises $H_2$ and $O_2$ in a $N_2$ atmosphere in the ratio of $H_2:O_2:N_2$ of 1:2:more than 20;

thereafter removing said mask;

depositing a layer of polysilicon overlying said first gate oxide layer in said low voltage active area and overlying said first and second gate oxide layers in said high voltage active area; and patterning said polysilicon layer to form gate electrodes for said low voltage and said high voltage transistors in the fabrication of said integrated circuit.

2. The method of claim 1 wherein said first gate oxide layer has a thickness of between about 30 and 70 Angstroms.

3. The method of claim 1 wherein said second gate oxide layer has a thickness of between about 45 and 100 Angstroms.

4. The method of claim 1 wherein said first gate oxide layer in said low voltage active area has a thickness of between about 30 and 70 Angstroms.

5. The method of claim 1 wherein said first and second gate oxide layers in said high voltage active area have a combined thickness of between about 75 and 170 Angstroms.

6. The method of claim 1 wherein said active areas are isolated from other said active areas by shallow trench transistor will be formed wherein said high voltage transistor has a voltage higher than said low voltage transistor;

first wet oxidizing the surface of said semiconductor substrate to form a first layer of gate oxide on the surface of said semiconductor substrate in said active areas;

removing said first layer of gate oxide in said low voltage area;

second wet oxidizing the surface of said semiconductor substrate to form a second layer of gate oxide on said surface of said semiconductor substrate in said low voltage area and to form a second layer of gate oxide under said first gate oxide layer in said high voltage active area;

depositing a layer of polysilicon overlying said second gate oxide layer in said low voltage active area and overlying said first and second gate oxide layers in said high voltage active area; and patterning said polysilicon layer to form gate electrodes for said low voltage and said high voltage transistors in the fabrication of said integrated circuit.

7. The method according to claim 6 wherein said shallow trench isolation comprises high density plasma chemically vapor deposited oxide.

8. The method according to claim 1 wherein said step of first wet oxidizing said semiconductor substrate utilizes $H_2$ and $O_2$ in a $N_2$ atmosphere in the ratio of $H_2:O_2:N_2$ of 1:2:20.

9. The method of simultaneously forming both a high voltage and a low voltage transistor in the manufacture of an integrated circuit comprising:

providing shallow trench isolation regions within a semiconductor substrate wherein active areas of said substrate are isolated from other active areas and wherein there is at least one low voltage area in which said low voltage transistor will be formed and at least one high voltage area in which said high voltage transistor will be formed wherein said high voltage transistor has a voltage higher than said low voltage transistor;

first wet oxidizing the surface of said semiconductor substrate to form a first layer of gate oxide on the surface of said semiconductor substrate in said active areas wherein said first wet oxidizing said semiconductor substrate utilizes $H_2$ and $O_2$ in a $N_2$ atmosphere in the ratio of $H_2:O_2:N_2$ of 1:2:20;

removing said first layer of gate oxide in said low voltage area;

second wet oxidizing the surface of said semiconductor substrate to form a second layer of gate oxide on said surface of said semiconductor substrate in said low voltage area and to form a second layer of gate oxide under said first gate oxide layer in said high voltage active area wherein said second wet oxidizing said semiconductor substrate utilizes $H_2$ and $O_2$ in a $N_2$ atmosphere in the ratio of $H_2:O_2:N_2$ of 1:2: more than 20;

depositing a layer of polysilicon overlying said second gate oxide layer in said low voltage active area and overlying said first and second gate oxide layers in said high voltage active area; and patterning said polysilicon layer to form gate electrodes for said low voltage and said high voltage transistors in the fabrication of said integrated circuit.

10. The method of claim 9 wherein said first gate oxide layer has a thickness of between about 45 and 100 Angstroms.

11. The method of claim 9 wherein said second gate oxide layer has a thickness of between about 30 and 70 Angstroms.

12. The method of claim 9 wherein said second gate oxide layer in said low voltage active area has a thickness of between about 30 and 70 Angstroms.

13. The method of claim 9 wherein said first and second gate oxide layers in said high voltage active area have combined thickness of between about 75 and 170 Angstroms.

14. The method according to claim 9 wherein said shallow trench isolation comprises high density plasma chemically vapor deposited oxide.

15. The method of simultaneously forming both a high voltage and a low voltage transistor in the manufacture of an integrated circuit comprising:

providing shallow trench isolation regions within a semiconductor substrate wherein active areas of said substrate are isolated from other active areas and wherein there is at least one low voltage area in which said low voltage transistor will be formed and at least one high voltage area in which said high voltage transistor will be formed wherein said high voltage transistor has a voltage higher than said low voltage transistor and wherein said shallow trench isolation comprises high density plasma chemically vapor deposited oxide;

first wet oxidizing the surface of said semiconductor substrate to form a first layer of gate oxide on the surface of said semiconductor substrate in said active areas wherein said first wet oxidizing said semiconductor substrate utilizes $H_2$ and $O_2$ in a $N_2$ atmosphere in the ratio of $H_2:O_2:N_2$ of 1:2:20;

covering said low voltage active area with a mask;

second wet oxidizing the surface of said semiconductor substrate where it is not covered by said mask to form a second layer of gate oxide underlying said first gate oxide layer in said high voltage active area wherein said second wet oxidizing said semiconductor substrate utilizes $H_2$ and $O_2$ in a $N_2$ atmosphere in the ratio of $H_2:O_2:N_2$ of 1:2: more than 20;

thereafter removing said mask;

depositing a layer of polysilicon overlying said first gate oxide layer in said low voltage active area and overlying said first and second gate oxide layers in said high voltage active area; and patterning said polysilicon layer to form gate electrodes for said low voltage and said high voltage transistors in the fabrication of said integrated circuit.

16. The method of claim 15 wherein said first gate oxide layer has a thickness of between about 30 and 70 Angstroms.

17. The method of claim 15 wherein said second gate oxide layer has a thickness of between about 45 and 100 Angstroms.

18. The method of claim 15 wherein said first gate oxide layer in said low voltage active area has a thickness of between about 30 and 70 Angstroms.

19. The method of claim 15 wherein said first and second gate oxide layers in said high voltage active area have combined thickness of between about 50 and 120 Angstroms.

* * * * *